US009308571B2

(12) United States Patent
Kempers et al.

(10) Patent No.: US 9,308,571 B2
(45) Date of Patent: Apr. 12, 2016

(54) HEAT-TRANSFER STRUCTURE

(71) Applicant: Alcatel Lucent, Boulogne-Billancourt (FR)

(72) Inventors: Roger Scott Kempers, Dublin (IE); Shankar Krishnan, Richland, WA (US); Alan Michael Lyons, New Providence, NJ (US); Todd Richard Salamon, Chatham, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 0 days.

(21) Appl. No.: 14/491,360

(22) Filed: Sep. 19, 2014

(65) Prior Publication Data

US 2015/0014841 A1 Jan. 15, 2015

Related U.S. Application Data

(63) Continuation of application No. 12/143,594, filed on Jun. 20, 2008, now Pat. No. 8,963,323.

(51) Int. Cl.
*H01L 23/42* (2006.01)
*B21D 53/02* (2006.01)
(Continued)

(52) U.S. Cl.
CPC ............... *B21D 53/02* (2013.01); *F28F 21/00* (2013.01); *H01L 23/367* (2013.01); *H01L 23/3677* (2013.01); *H01L 23/3736* (2013.01); *H01L 23/42* (2013.01); *H01L 24/64* (2013.01); *H01L 24/66* (2013.01); *H01L 24/69* (2013.01); *H01L 25/0657* (2013.01); *H01L 2225/06527* (2013.01); *H01L 2225/06575* (2013.01); *H01L 2225/06589* (2013.01); *H01L 2924/01005* (2013.01); *H01L 2924/01006* (2013.01);
(Continued)

(58) Field of Classification Search
CPC ................................ H01L 24/64; H01L 24/69
USPC .......................................... 257/686, 712, 787
See application file for complete search history.

(56) References Cited

U.S. PATENT DOCUMENTS 5,172,473 A 12/1992 Burns et al.
6,011,694 A * 1/2000 Hirakawa ....................... 361/774
(Continued)

FOREIGN PATENT DOCUMENTS

EP 1901350 A1 3/2008
JP S63100759 A 5/1988
(Continued)

OTHER PUBLICATIONS

Foreign Communication Related to a Counterpart Application, Japanese Application No. 2011-514616, Japanese Office Action dated Jul. 31, 2014, 6 pages.

*Primary Examiner* — Matthew W Such
*Assistant Examiner* — Krista Soderholm
(74) *Attorney, Agent, or Firm* — Hitt Gaines, P.C.

(57) ABSTRACT

An apparatus comprising a first substrate having a first surface, a second substrate having a second surface facing the first surface and an array of metallic raised features being in contact with the first surface to the second surface, a portion of the raised features having a mechanical bend or buckle plastic deformation produced therein via a compressive force. One or more of the metallic raised features has one or more surface singularities therein prior to the mechanical bend or the buckle plastic deformation produced by the compressive force.

12 Claims, 11 Drawing Sheets

(51) Int. Cl.
*H01L 23/367* (2006.01)
*H01L 23/00* (2006.01)
*H01L 25/065* (2006.01)
*F28F 21/00* (2006.01)
*H01L 23/373* (2006.01)

(52) U.S. Cl.
CPC ............. *H01L 2924/01013* (2013.01); *H01L 2924/01029* (2013.01); *H01L 2924/01033* (2013.01); *H01L 2924/01047* (2013.01); *H01L 2924/01049* (2013.01); *H01L 2924/01057* (2013.01); *H01L 2924/01075* (2013.01); *H01L 2924/01078* (2013.01); *H01L 2924/01079* (2013.01); *H01L 2924/01082* (2013.01); *H01L 2924/14* (2013.01); *Y10T 29/4935* (2015.01); *Y10T 428/12396* (2015.01); *Y10T 428/24562* (2015.01); *Y10T 428/24851* (2015.01)

(56) References Cited

U.S. PATENT DOCUMENTS

| | | | |
|---|---|---|---|
| 6,245,186 | B1 | 6/2001 | Alcoe et al. |
| 6,365,500 | B1 | 4/2002 | Chang et al. |
| 6,374,490 | B1 | 4/2002 | Miyahara |
| 6,462,952 | B1 | 10/2002 | Ubukata et al. |
| 7,005,751 | B2 | 2/2006 | Khandros et al. |
| 7,294,919 | B2 | 11/2007 | Bai |
| 2001/0006258 | A1* | 7/2001 | Hur ................... 257/777 |
| 2002/0141155 | A1 | 10/2002 | Pinneo |
| 2003/0025202 | A1 | 2/2003 | Mikagi et al. |
| 2003/0052156 | A1* | 3/2003 | Kim et al. ........... 228/180.22 |
| 2003/0116312 | A1 | 6/2003 | Krassowski et al. |
| 2003/0205363 | A1 | 11/2003 | Chu et al. |
| 2004/0099944 | A1 | 5/2004 | Kimura |
| 2005/0017350 | A1* | 1/2005 | Corti et al. ................ 257/706 |
| 2005/0195574 | A1 | 9/2005 | Chiba et al. |
| 2007/0267735 | A1 | 11/2007 | Awano et al. |
| 2008/0290504 | A1 | 11/2008 | Karavarkis et al. |
| 2009/0014205 | A1* | 1/2009 | Kobayashi et al. ........... 174/255 |
| 2009/0126903 | A1 | 5/2009 | Kuibira et al. |
| 2011/0165733 | A1 | 7/2011 | Haba et al. |
| 2012/0080799 | A1 | 4/2012 | Hohlfeld et al. |

FOREIGN PATENT DOCUMENTS

| | | |
|---|---|---|
| JP | S6476742 A | 3/1989 |
| JP | 07-161881 | 6/1995 |
| JP | H0888300 A | 4/1996 |
| JP | H10513611 A | 12/1998 |
| JP | 2001345405 A | 12/2001 |
| JP | 2002033429 A | 1/2002 |
| JP | 2002198473 A | 7/2002 |
| JP | 2006134989 A | 5/2006 |
| JP | 2007294554 A | 11/2007 |
| WO | 02/100145 A1 | 12/2002 |

* cited by examiner

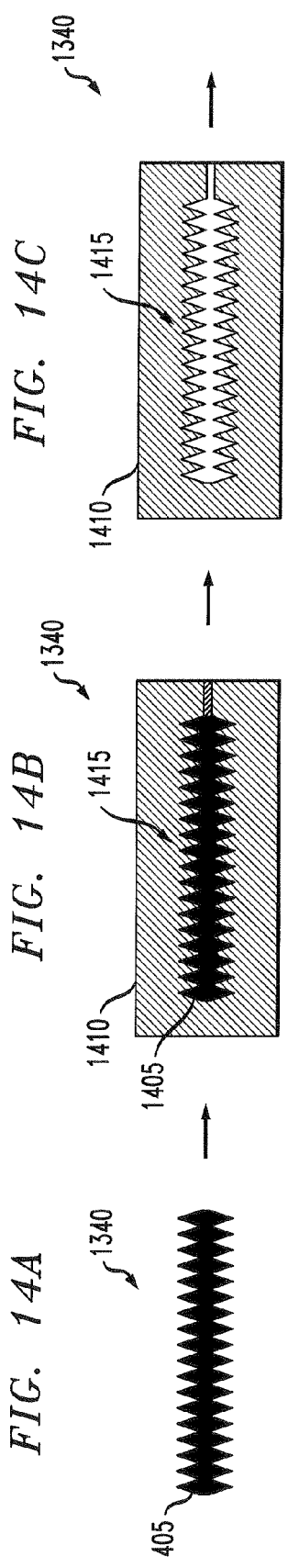
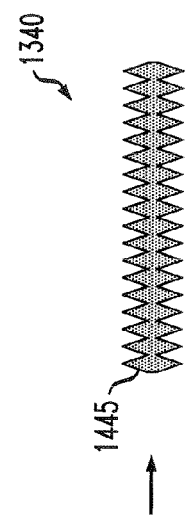
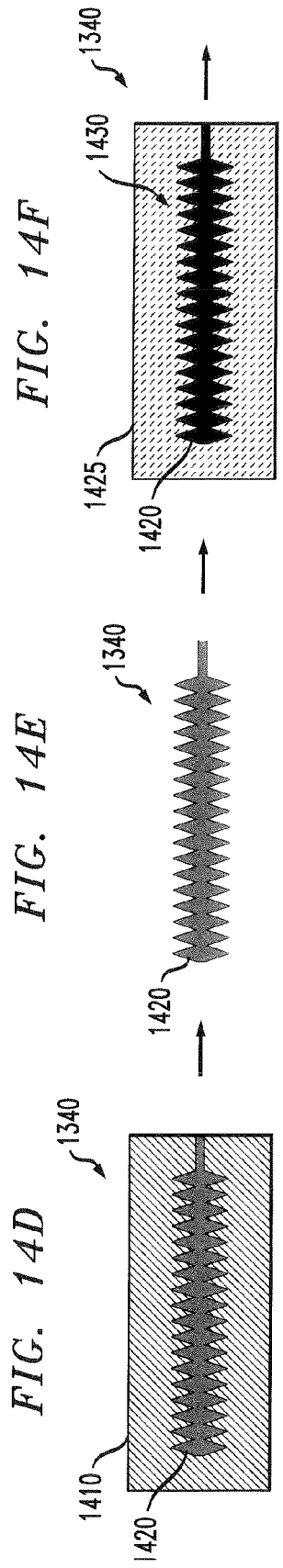
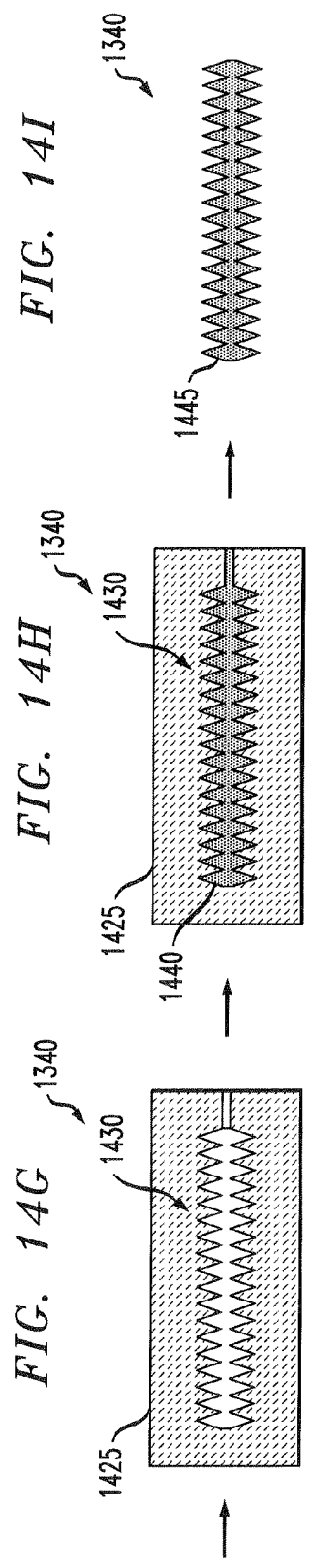

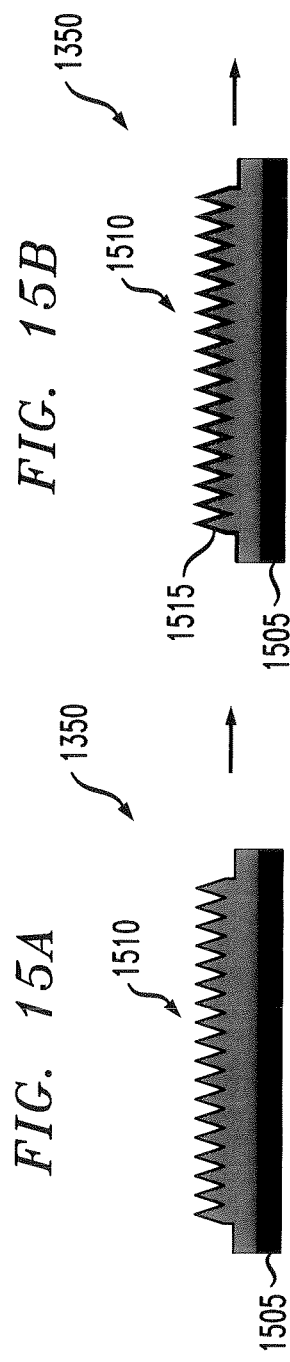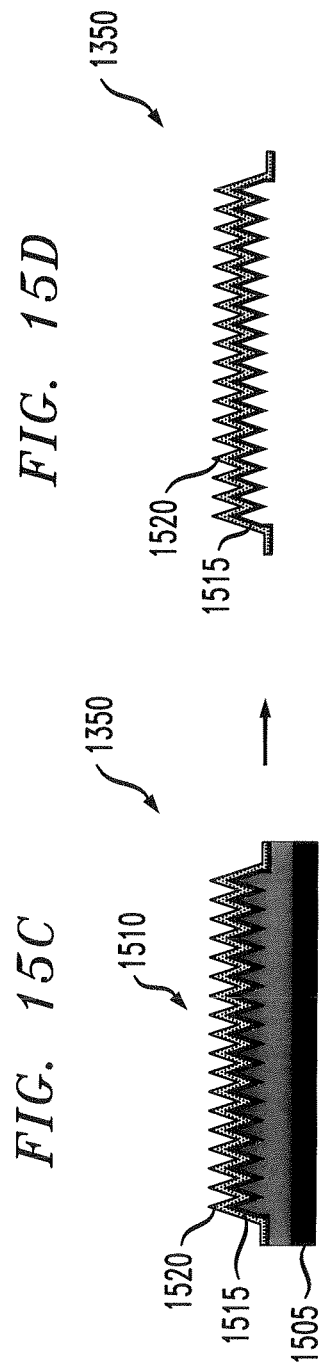

HEAT-TRANSFER STRUCTURE

CROSS-REFERENCE TO RELATED APPLICATION

This application is a continuation application of U.S. application Ser. No. 12/143,594, filed by Roger Scott Kempers, et al. on Jun. 20, 2008, entitled "A HEAT-TRANSFER STRUCTURE" incorporated herein by reference in its entirety.

TECHNICAL FIELD OF THE INVENTION

The present disclosure is directed, in general, to an apparatus that comprises a thermal interface material and methods of manufacture thereof.

BACKGROUND OF THE INVENTION

Conventional thermal interface materials (TIMs) are often composites of thermally conductive particles dispersed in a thermally insulating organic matrix (e.g., adhesive or grease). The thermal conductivity of such composites is limited by the relatively low concentration of particles, as often needed to assure proper viscosity, and, by the thermal resistance of particle-particle contacts. Additionally, air-filled voids, which have poor thermal conductivity, can accumulate in the organic matrix, thereby decreasing the overall thermal conductivity of the TIM. Soft metals, such as Indium, or other soft materials, such as graphite, are also sometimes used as thermal interface materials. Although the thermal conductivity of these materials is higher than the composite materials, they have limited ability to comply with non-planar or irregular surfaces. Some of these soft materials are susceptible to corrosion, and, can have low melting points. All of these limitations can restrict reliability, applicability and assembly options.

SUMMARY OF THE INVENTION

One embodiment is an apparatus comprising a first substrate having a first surface, a second substrate having a second surface facing the first surface and an array of metallic raised features being in contact with the first surface to the second surface, a portion of the raised features having a mechanical bend or buckle plastic deformation produced therein via a compressive force. One or more of the metallic raised features has one or more surface singularities therein prior to the mechanical bend or the buckle plastic deformation produced by the compressive force.

Another embodiment is an apparatus comprising a metallic planar substrate having a front surface and a back surface, the back surface being opposite the front surface. The apparatus also comprises an array of metallic raised features located directly on each of the front and back surfaces. A portion of the raised features are configured to be mechanically bend or buckle plastically deformable via a compressive force applied between a first substrate and a second substrate. One or more of the metallic raised features has a surface singularity therein prior to the mechanical bend or the buckle plastic deformation produced by the compressive force.

BRIEF DESCRIPTION OF THE DRAWINGS

The embodiments of the disclosure are best understood from the following detailed description, when read with the accompanying FIGUREs. Corresponding or like numbers or characters indicate corresponding or like structures. Various features may not be drawn to scale and may be arbitrarily increased or reduced in size for clarity of discussion. Reference is now made to the following descriptions taken in conjunction with the accompanying drawings, in which:

FIGS. 14A-14I present plan views of selected stages of an example embodiment of manufacturing an apparatus of the disclosure, e.g., as in FIG. 13; and FIGS. 15A-15D present cross-sectional views of selected stages of an example embodiment of manufacturing an apparatus of the disclosure, e.g., as in FIG. 13.

DETAILED DESCRIPTION

Figure 1A:
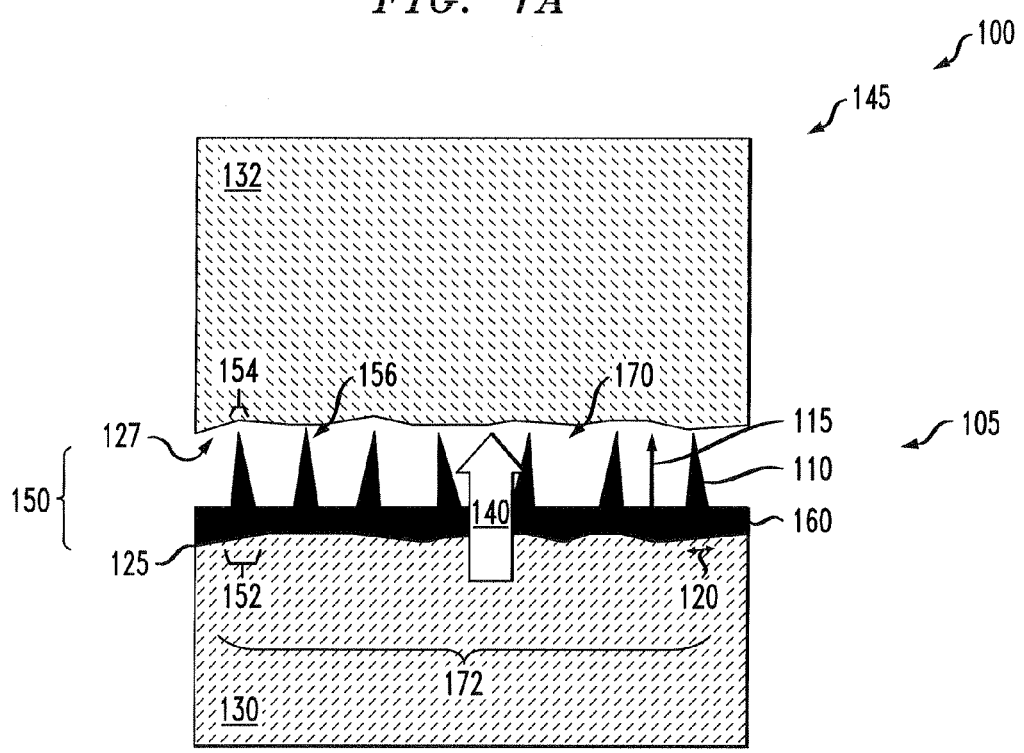
FIGS. 1A-1B present cross-sectional views of example apparatuses of the disclosure before compression.
Figure 1B:
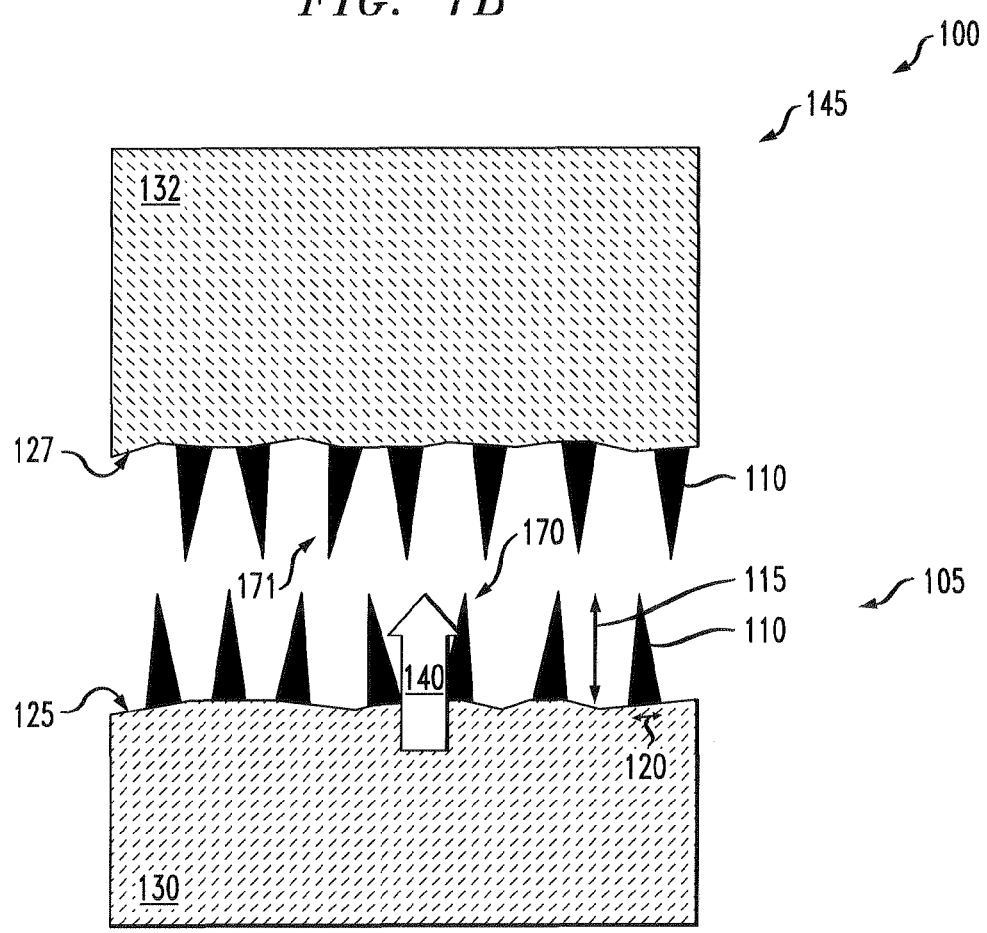

FIGS. 1A and 1B shows cross-sectional views of an example apparatuses 100. The apparatus 100 comprises a heat-transfer structure 105 having designed metallic deformable raised features 110. The metallic deformable raised features 110 are configured to be compressed in at least one dimension 115 as compared to a pre-deformed shape, such as the pre-deformed shape of the raised feature 110 depicted in FIG. 1A.

Generally, for greater amounts of compression there is improved heat-transfer. However, greater amounts of compressive force are required to achieve greater degrees of compression which could inadvertently damage components of the apparatus 100. Therefore the amount of compression in the at least one dimension 115 is carefully balanced between the benefit of improved heat transfer versus damaging the apparatus. In some preferred embodiments the metallic deformable raised features 110 are configured to be compressed at least one selected dimension (e.g., a height) by at least about 1 percent as compared to the pre-deformed shape. In other preferred embodiments the metallic deformable raised features 110 are configured to be compressed in the at least one selected dimension 115 by at least about 5 percent and in some cases at least about 25 percent.

In some preferred embodiments, the individual raised features 110 are millimeter-size or smaller structures. That is, each of the metallic deformable raised features 110 have at least one second dimension 120 (e.g., a width, height or thickness) of about 1 millimeter or less. Millimeter-sized raised features can advantageously comply (e.g., make close contact) with the irregular surface or rough surface of some components and thereby improve heat transfer between components. Millimeter-sized raised features also advantageously require lower amounts of compressive force to deform than larger-sized raised features 110, thereby reducing the risk of damaging components of the apparatus 100 when the raised features 110 are compressed.

The term designed, as used herein, refers to the raised features 110 as having one or more solid shapes that are intentionally-created according to the principles and by procedures described herein. The raised features 110 are designed to mechanically deform and thereby comply with non-uniformities of the interface surfaces 125, 127 of substrates or components 130, 132 of the apparatus 100, while maintaining a continuous thermal path across a direction 140 of heat flow. For instance, the raised features 110 are designed to physically contact both surfaces 125, 127 regardless of whether the surfaces 125, 127 are coplanar as shown in FIG. 1A or whether one or both or the surfaces 125, 127 are curved or other wise non-planar. The designed raised features 110 contrast to surface finishes that may naturally occur on some metal structures, or, that may inadvertently occur, as a consequence of forming a metal structure through precipitation, cutting, hammering or other fabrication processes.

For clarity, certain design aspects are presented as a single element in example raised features. It should be understood, however, that some preferred embodiments of the raised features 110 can combine multiple design aspects in a single structure.

In some embodiments the apparatus further includes an electrical device 145. For example, when the apparatus 100 is a remote radio head, base station, computer or other part of a telecommunication system, the electrical device 145 can be a circuit board. The device can have at least two components 130, 132 that contact each other at interfacial surface 125, 127 and the heat-transfer structure 105 is located between interfacial surfaces 125, 127. Example embodiments of components 130, 132 include a heat sink or a heat source (e.g., an integrated circuit).

The raised features 110 of the present disclosure are designed to be mechanically compressed by a deforming pressure that is sufficient to cause compression of the raised features (e.g., by least by at least about 1 percent). However, the deforming pressure typically is carefully adjusted to avoid compressing or otherwise deforming or damaging the components 130, 132 of the apparatus 100 which may also experience the deforming pressure. For example, components 130, 132 located under or over the heat-transfer structure 105 could be damaged if the deforming pressure is excessive.

The term raised, as used herein, means that the metallic material that the raised features 110 are made of is non-coplanar with a surface 125 that the raised features 110 are located on. For example, in some embodiments, the metallic deformable raised features 110 can be located, and in some cases formed directly, on a surface 125 of a component 130 of the apparatus 100.

Figure 2:
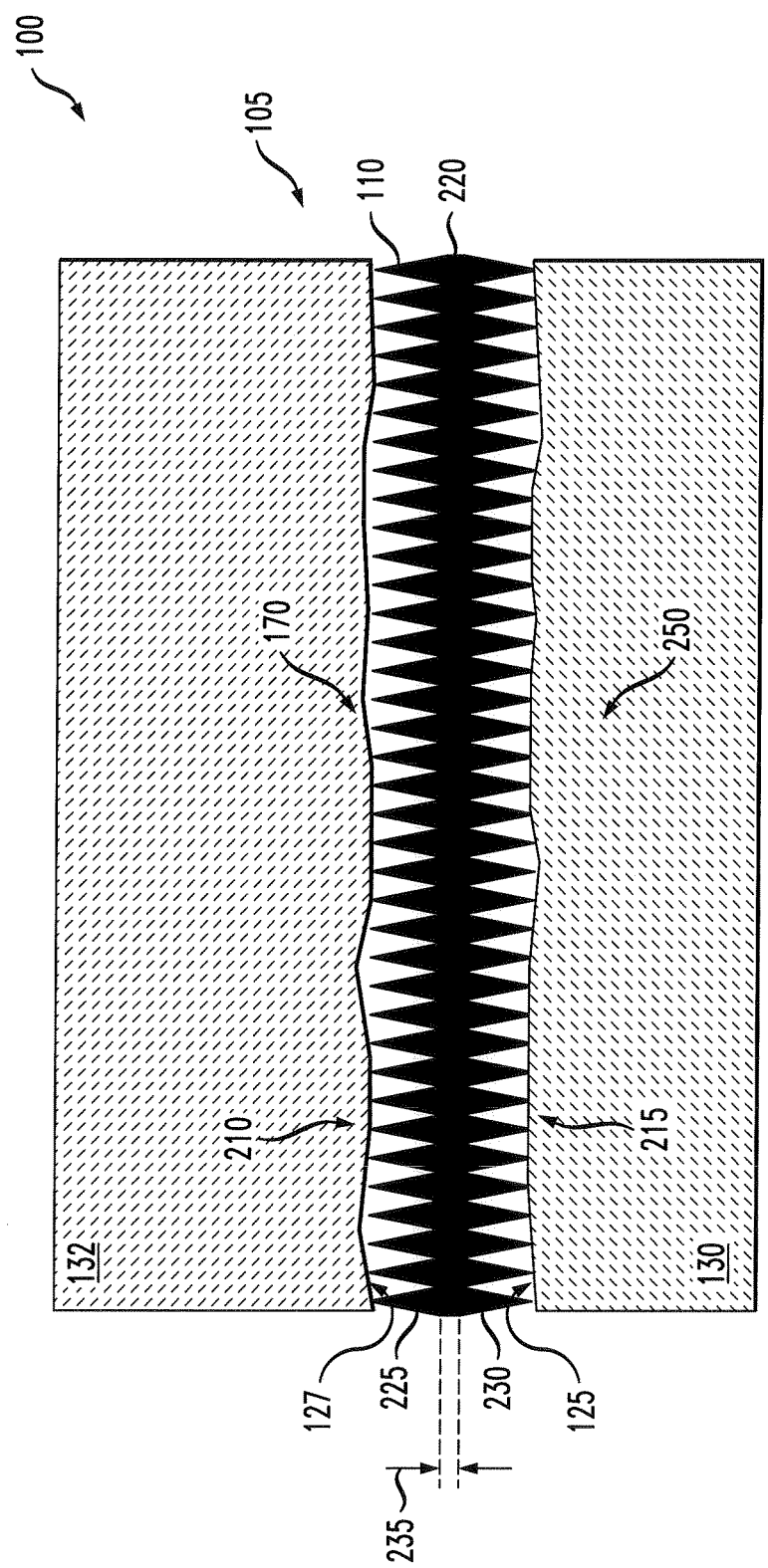
FIG. 2 presents a cross-sectional view of an example apparatus of the disclosure before compression.

In other embodiments, such as illustrated in the cross-sectional view present in FIG. 2, the raised features 110 can be located, and in some cases formed directly, on one or more surfaces 210, 215, of a substrate 220 which is also part of the heat-transfer structure 105, and not a separate component of the apparatus. In such embodiments, the apparatus 100 can consist of only the heat-transfer structure 105 comprising the raised features 110 and substrate 220, or, can further include other components (not shown) similar to that depicted in FIG. 1A. In some embodiments, the raised features 110 can be located on one or both of the surfaces 210, 215, of a first side 225 and an opposite second side 230 of a planar substrate 220. In some cases, the substrate 220 is a deformable metallic substrate made of the same metal or different metal as the raised features 110. For instance, an example substrate 220 can be a planar metal foil having a thickness 235 in the range of about 10 to 1000 microns. However, in other embodiments, to further facilitate conformance to the surface of a component, the substrate 220 can be curved or have other non-planar shapes.

In some cases, the second dimension 120 can be the same as the first dimension 115. For example, the first and second dimension 115, 120 can both correspond to a height 150 of the raised features which can be about 1 millimeters or less. In other cases, such as depicted in FIG. 1A, the second dimension 120 can correspond to a width 152 of the raised feature 110. In some cases, when the raised feature 110 does not have a uniform width 152 (e.g. the width of the raised feature is tapered) at least one portion of the width (e.g., the width 154 at the tops 156 of the raised features 110) is about 1 millimeters or less. In still other cases, the second dimension 120 can correspond to a thickness of the raised feature 110. For example, as discussed below in the context of FIG. 9, when the raised feature 110 is hollow, the second dimension 120 can correspond to a thickness of an outer wall of the raised feature 110.

Figure 3:
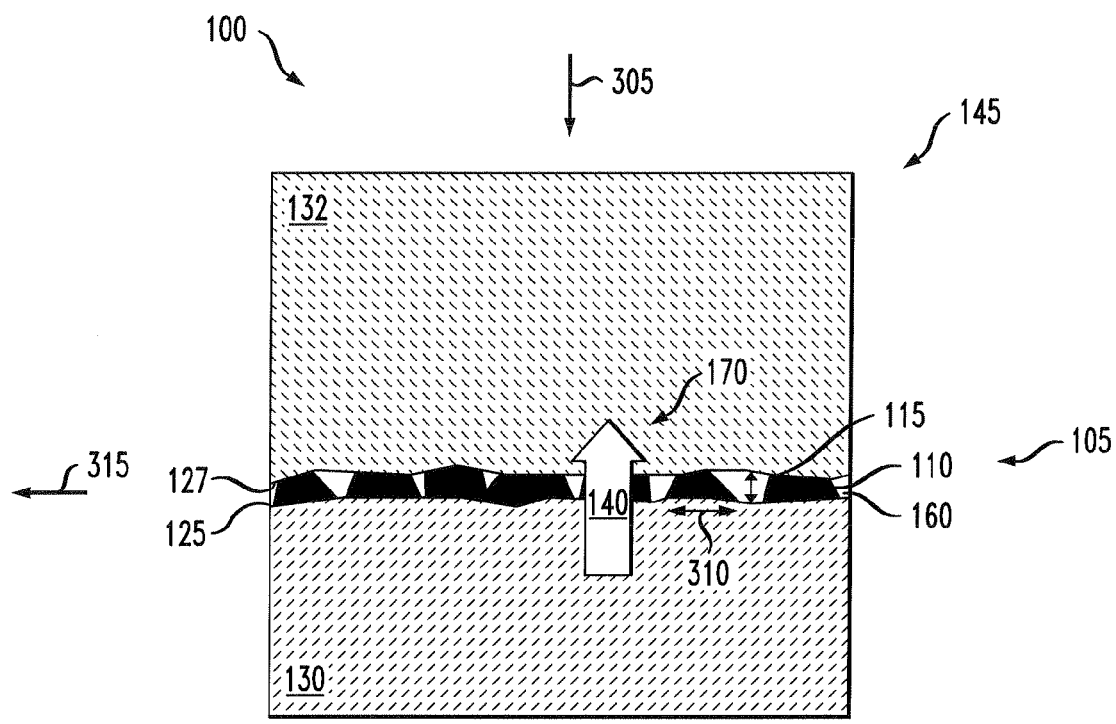
FIG. 3 presents a cross-sectional view of the example apparatus shown in FIG. 1A after compression.

FIG. 3 shows a cross-sectional view of the example apparatus 100 presented in FIG. 1A after the metallic deformable raised features 110 have been compressed in the at least one dimension 115. For example, a deforming pressure 305 can be applied to the raised features 110 by bringing a surface of a second component 132 in contact with tops 156 (FIG. 1A) of the raised features 110, and pressing the second component 132 of the apparatus 110 towards the first component 130 that the raised features 110 are located on.

Compression in the at least one dimension 115 can occur by bending or buckling of the shape of the raised features 110, or by other modes of changing the shape of the raised features 110. As further discussed below, the raised features 110 can be specially designed to have shapes and dimensions that facilitate the efficient compression of the raised features 110 with a minimum of applied deforming pressure 305. In particular, the selection of the shape and dimension of the raised features 110, the spacing between raised features 110 and the types of material used to form the raised features 110 are all newly discovered result-effective variables to control the manner and extent to which the raised features 110 are compressed for a given applied pressure 305 to facilitate heat transfer.

In some preferred embodiments, the compressed dimension 115 is parallel to the direction 140 of heat flow. This can facilitate compressed ones of the raised features 110 to form a continuous phase of metal directly thermally and physically linking one surface 125 of a component 130 to a second surface 127 of a second component 132 along the heat transfer direction 140. Having the metal of the compressed raised features 110 as the predominant continuous phase in the direction of heat flow 140 facilitates heat transfer between the components 130, 132. This is in contrast to traditional TIMs, where the organic matrix with relatively poor heat conductivity, is the predominate continuous phase in the direction of heat flow.

As illustrated in FIG. 1A, prior to compression, the raised features 110, can be discrete structures that do not directly contact each other. As illustrated in FIG. 3, compression in the one dimension 115 can result in a simultaneous increase in another dimension 310 of the raised feature 110 that is substantially perpendicular to the compressed dimension 115 and applied deforming pressure 305. For some embodiments, such as illustrated in FIG. 3, after compression, the raised features 110 can be sufficiently enlarged or increased in the other dimension 310 to physically contact laterally adjacent raised features 110. The lateral contact between adjacent raised features 110 can also advantageously facilitate heat transfer. For instance, the lateral contact between adjacent one of the raised features 110 can help to dissipate heat away from a localized area of high heat generation (e.g., a hot-spot) within a component 130, 132.

As illustrated in FIGS. 1 and 3, the surfaces 125, 127 of components 130, 132 can have non-uniformities. The non-uniformities on component surfaces 125, 127 can include local irregularities such as voids, pits, machining marks, or, more de-localized irregularities such as concave or convex areas or surfaces or other non-planar areas or surfaces. In some preferred embodiments, the compressed ones of the raised features 110 are conformally contoured to the irregular non-planar surface 127 of a component 132 of the apparatus 100. For instance, the raised features 110 can be designed to be tall enough such that, after being compressed, they provide a continuous phase of metal physically and thermally linking the surfaces 125, 127 of the components 130, 132. By being compressible to different extents, the array 170 of raised features 110 facilitate compliant linking across irregular surfaces 125,127. This is in contrast to traditional soft metals or other soft materials, like indium or graphite, which have poor ability to comply with the irregular non-planar surfaces of some components.

In some cases, such as when both of the interfacial surfaces 125, 127 of the components 130, 132 are irregular, or at least one surface 132 is highly irregular, it can be especially advantageous to use a heat-transfer structure 105 such as depicted in FIG. 2. A heat-transfer structure 105 having dual-sided raised features 110 (e.g., raised features 110 on both sides 225, 230 of the substrate 220) may have the ability to more precisely conform to the both of the irregular surfaces 125, 127, than single-sided raised features 110 (e.g., raised features 110 on one of the sides 225, 230 of the substrate 220, or on one component 130). In other cases, however, raised features 110 formed directly on the irregular surface 130 such as shown in FIG. 1A can provide the desired conformity to the surface 130.

In still other cases, raised features 110 can be formed on both of the interfacial surfaces 125, 127 of the components 130, 132. For example one surface 127 could be the surface of a heat sink 132, and the other surface 125 could be the lid of a packaged integrated circuit. In some such embodiments, such as shown in FIG. 1B, the raised features 110 on the respective interfacial surfaces 125, 127 can be staggered such that the raised features 110 (e.g., the array 170 of raised features 110) on one surface 125 interdigitate with the raised features 110 (e.g., the arrays 170, 171 of raised features 110) on another surface 127 when the deforming pressure is applied. The raised features 110 can have the same or different structures (e.g., same or different height, shapes etc. . . . ) on either or both of the two surface 125, 127.

As further illustrated in FIGS. 1A and 3, in some embodiments, an adhesive or thermal grease 160 can be located between adjacent one of the metallic deformable raised features 110. In some cases, the adhesive 160 can helps to hold the components 130, 132 (e.g., thermally coupled components 130, 132) together. In some cases, the thermal grease 160, such as a thixotropic grease can improve heat transfer performance by reducing or eliminating air pockets between the interfacial surfaces 125, 127 (e.g., the surfaces 125, 127 that face each other). In some preferred embodiments the raised features 110 are designed or spaced so that when the raised features 110 are compressed the adhesive or thermal grease 160 can freely move between the raised features 110. For instance, there can be a continuous phase of adhesive or thermal grease 160 in a direction 315 perpendicular to the compressed dimension 115. In other cases there can be discrete regions of adhesive or thermal grease 160 between the raised features 110.

The metal or metals that the raised features 110 and optional substrate 220 are made of can be carefully selected to meet criterion applicable to the application of the heat-transfer structure 105. Sometimes, to minimize the thermal resistance across the interfacial surfaces 125, 127 of the components 130, 132, it is desirable to maximize the thermal conductivity of the metal and minimize the modulus of that metal. Other relevant considerations include the resistance of the metal to corrosion, oxidation and creep or the cost of the metal. In addition, the melting point of the metal should be well above operating temperatures of the apparatus 100 to ensure that the heat-transfer structures 105 does not melt or creep. Examples of low-modulus (e.g., bulk modulus), high-thermal-conductivity metals which are resistant to oxidation and corrosion include silver, copper, aluminum, tin, lead, nickel, indium or alloys thereof.

In some preferred embodiments, the raised features 110 can have a tapered shape. For instance, as illustrated in FIG. 1A in some embodiments raised features can be cone-shaped. Raised features with a tapered shape can advantageously require a lower amount of deforming pressure to be compressed than a similar-sized non-tapered raised feature 110. The reduced pressure needed to compress raised features with a tapered shape results from the smaller amount of material that needs to be compressed as compared to non-tapered shapes (e.g., smaller amount of material moves during a plastic deformation than in a non-tapered raised feature of the same maximum width). Consider as an example a cone-shaped raised feature 110 having a base diameter 152 of 1 mm and height 150 of 2 mm. Some embodiments of the cone-shaped raised feature 110 can require a deforming pressure 305 of about 0.7 MPa to achieve a 50 percent reduction in height 150. In comparison a non-tapered raised feature 110, such as a cylindrically shaped post, of the same height and diameter equal to the base diameter 152, can require about 6 times or greater deforming pressure (e.g., to achieve a 50 percent reduction in height 150). Nevertheless, there can still be cases where a raised feature 110 having a non-tapered shaped (e.g., a post) is preferred because the thermal resistance through a cone can be higher than for a cylinder.

To illustrate additional design aspects, FIGS. 4-11 present perspective or cross-sectional views of some example embodiments of the metallic deformable raised features 110. For clarity, the same reference numbers as used in FIGS. 1-3 are used to depict analogous aspects of the structures depicted in FIGS. 4-11.

Figure 4:
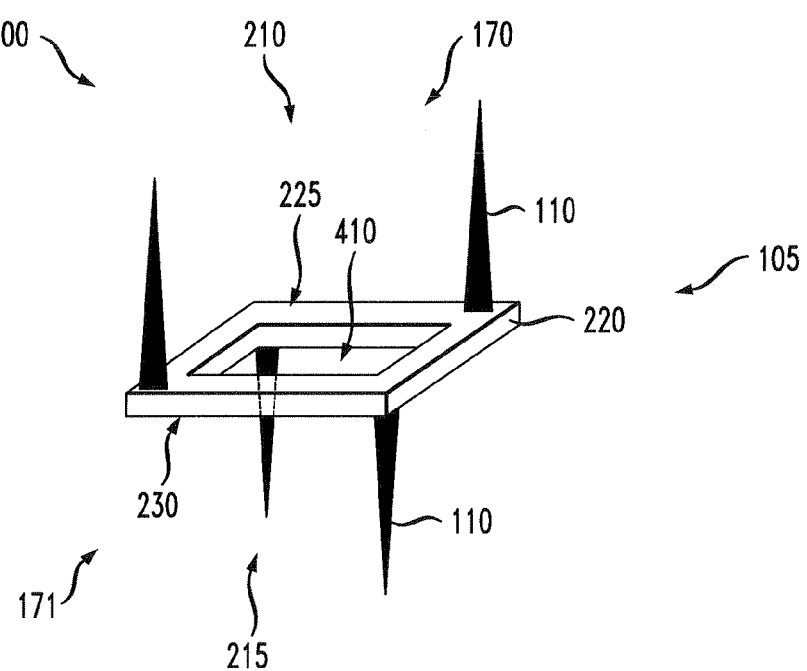
FIGS. 4-11 shows perspective or cross-sectional views of example raised features of the apparatus of the disclosure.

FIG. 4 shows a perspective view of an example embodiment of the apparatus 100, where the heat-transfer structure includes a two-dimensional array 170 of raised features 110. Similar to the embodiment shown in FIG. 2, the metallic deformable raised features 110 are located on one side 225 (e.g., a first side) and an opposite side 230 (e.g., a second side) of a planar deformable metallic substrate 220. To facilitate a conformal contour to the irregular surface of one component, the locations of the raised features 110 on the opposite side 230 are staggered with respect to locations of raised features 110 on one side 225. By staggering the locations of the raised features 110 on the two sides 225, 230 a two dimension array 170 of raised features 110 is formed on both sides 225, 230. Such staggered raised feature 110 locations can promote compression via bending modes with a minimal applied pressure 305 (FIG. 3) to achieve the desired compression.

As further illustrated in FIG. 4 some embodiments of the heat-transfer structures 105 can include openings 410 in the substrate 220, the openings 410 can be located between the locations of the raised features 110 on the substrate 220. The openings 410 can extend from one side 225 to the other side 230 of the substrate 220. The openings 410 can advantageously allow the flow of adhesive or grease 160 (FIG. 1A or 3) between the upper and lower surfaces 125, 127 of components 130, 132 thus enhancing the flow of adhesive or grease in both lateral direction 315 as well as along the direction of heat flow 140.

Figure 5:
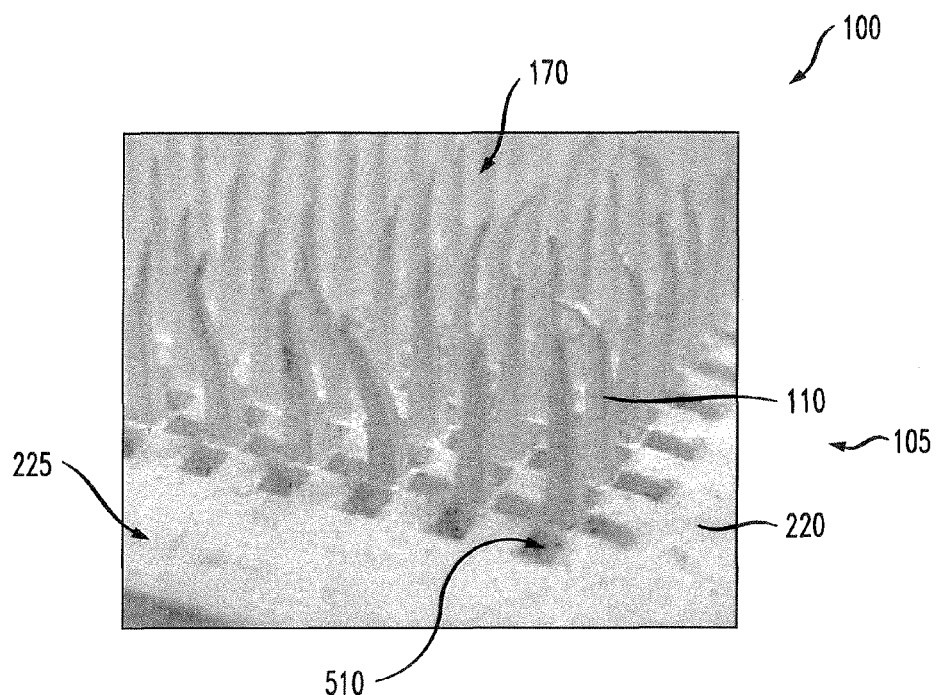

FIG. 5 shows a perspective view of another example embodiment of the apparatus 100 having a heat-transfer structure 105 with a two-dimensional array 170 of raised features 110. The substrate 220 also has an array 505 of openings 510 interspersed between the raised features 110 which are located on one side 225 of the substrate 220. The array 505 of openings 510 in the substrate 220 can facilitate the uniform dispersal of adhesive or thermal grease 160 (FIGS. 1A and 3) when the raised features 110 are compressed. For instance, an array 505 of openings 510 could allow adhesive 160 to flow easily and fill voids more effectively along the interfacial surfaces 125, 127 of the components 130, 132 (FIG. 3).

As further illustrated in FIG. 5, some embodiments of the raised features 110 can be configured as a uniformly distributed two-dimensional array 170. In other cases, however, the array 170 of raised features 110 can be randomly distributed. The raised features 110 depicted in FIG. 5 are substantially pyramidal-shaped. However, a variety of other shapes such as posts, cones, or loops could be similarly arranged as a two-dimensional array 170.

The shapes of the raised features 110 can be selected based on a balance between ease of manufacture and providing efficient heat transfer when compressed.

Figure 6:
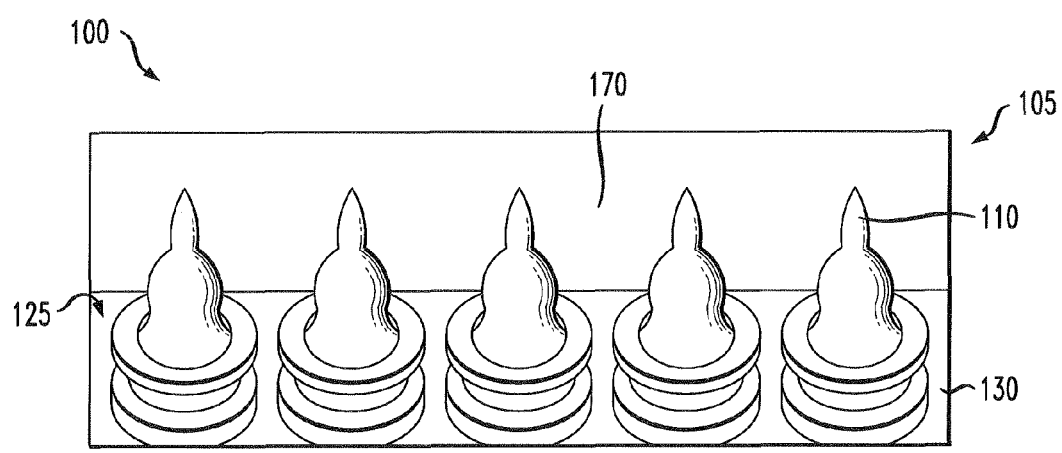

For example, as shown in the perspective view of FIG. 6, the raised features 110 can be an array 170 of posts, formed for example, as stud bumps using a wire bonding machine. Such raised features 110 have the advantage of being easy and inexpensive to form using existing manufacturing processes. Aluminum and gold, both highly thermally conductive metals, are commonly used in wire bonding equipment, although copper and other metals can be used. Moreover, such raised features 110 can be formed on a broad variety of surfaces, including directly on the surface 125 of a component 130, if desired.

Figure 7:
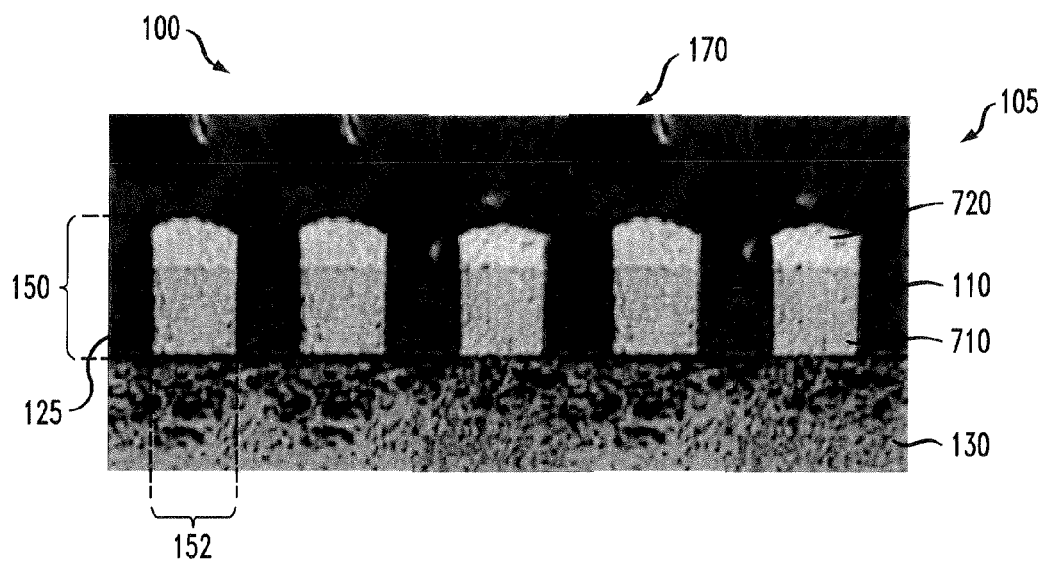
Figure 8:
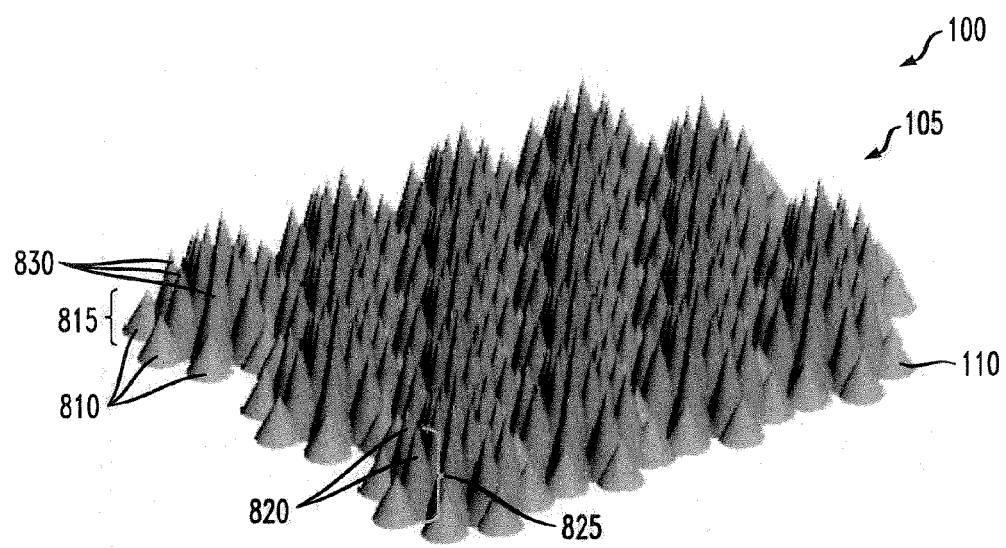

As another example, as shown in the cross-sectional view of FIG. 7, the raised features 110 can be an array 170 of electroplated posts. Such raised features 110 are inexpensive to form and manufacturing can be scaled-up to produce large numbers of heat-transfer structures 105. Moreover, such raised features 110 can also be formed on a broad variety of surfaces, including directly on the surface 125 of a component 130, if desired. Moreover, raised features 110 configured as electroplated posts can be fabricated to have high aspect ratios (e.g., height 150 to diameter 152 ratio of about 5:1 or greater, or, in the range of about 5:1 to 10:1). Metals such as silver and copper can be electroplated using existing manufacturing processes. Additionally, electroplated posts comprising multiple layers of different metals can be formed. For instance, the raised features 110 depicted in FIG. 7 can be configured as posts comprising a copper layer 710 and thinner tin layer 720. Raised features configured as multilayered posts (e.g., that are posts with multiple electroplated metal layers) can take advantage of the material properties of different metals, e.g., the high thermal conductivity of copper and the ductility of tin.

In some embodiments, such as shown in FIG. 7, each one of the raised features 110 can have substantially the same height 150 (e.g., the same height within 10 percent). In other embodiments, however, there can be at least two groups of raised features having different heights. Such an embodiment is depicted in the perspective view of FIG. 8, where the raised features 110 within a group 810 have the same height 815, while the raised features 110 within a second group 820 have a second height 825 the second heights 825 being at least about 10 percent greater than the first heights 815.

An array 170 of raised features 110 having groups 810, 820 with different heights 815, 825 can help minimize the total applied pressure required to achieve the desired level of conformity to an irregular component surface. During compression, the tallest group 830 of raised features 110 would compress first. In cases where there are relatively few numbers of raised features 110 in such groups 830 the applied deforming pressure required for compression would be very low. Thus for a given amount of applied pressure, the achievable compression would be larger compared to an array 170 of raised features 110 of uniform height. Once a certain level of compression is achieved, the next tallest group 820 of raised features 110 would begin to compress. This would increase the pressure required to incrementally improve conformity to the irregular surface of a component, but would beneficially increase the total number of thermal points of contact with the surface. This approach would work especially well when heat from hot-spots in a component need to be dissipated or when the component surface exhibits a high degree of irregularity.

Figure 9A:
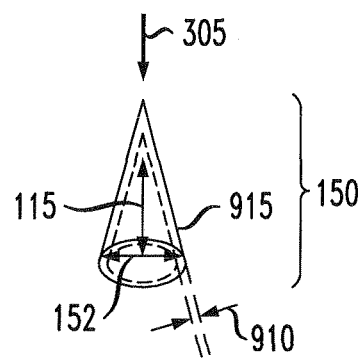
Figure 9B:
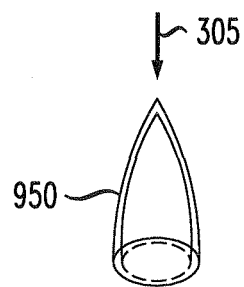
Figure 9C:
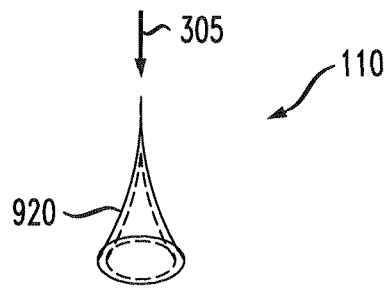
Figure 9D:
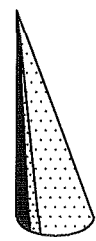

In some embodiments, such as illustrated in the perspective view of FIG. 9A-9C one or more of the raised features 110 can be hollow. Although hollow cones are depicted in FIGS. 9A-9C, any of the other shapes of the raised features 110 discussed herein could be configured as hollow structures. In some cases when the raised feature 110 is hollow, the second dimension 120 (FIG. 1A) can correspond to a thickness 910 of an outer wall 915 of the raised feature 110 (FIG. 9A).

One advantage of using hollow raised features 110 is that they can require significantly less pressure 305 to compress than equivalent solid raised features of the same size. Less pressure for compression is required because the thickness 910 of walls 915 of hollow raised features 110 can be made thinner than the over all thickness 152 of the raised feature. In addition, hollow raised features 110 can be compacted into a smaller lateral area because the walls 915 can move either towards the exterior or towards the interior of the hollow raised feature 110 when a deforming pressure 305 is applied. In some case, however, solid raised features 110 may be preferred because they contain more metal than hollow raised features 110, and consequently, can provide a more efficient heat transfer path.

In some embodiments, one or more of the raised feature 110 have a curve surface 925 (FIG. 9B, 9C, 9E) along the at least one dimension 115 that the raised feature 110 is configured to be compressed in. One advantage of such curved raised features 110 is that such structures can require significantly less pressure to compress than substantial equivalent non-curved raised feature 110. For instance, when a deforming pressure is applied to a curved raised feature 110, it will more easily bend than the equivalent non-curved raised feature.

To further illustrate some of the above-described embodiments, consider an example array 170 of raised features 110 configured as hollow copper cones, such as shown in FIG. 9A. Each cone has a base diameter 152 of about 1 mm and height 150 of about 2 mm, and a wall 915 thickness 910 of about 50 microns. The deforming pressure required to compress the height 150 by 75 percent is only about 17 percent of the pressure required to compress a similar array 170 of the same-sized but solid copper cones. The pressure 305 required to similarly compress a similar array 170 of raised features 110 configured as hollow convex copper cones, such as shown in FIG. 9B, is about 15 percent of that required for the solid cones. The pressure 305 required to similarly compress a similar array 170 of raised features 110 configured as hollow concave copper cones, such as shown in FIG. 9C, is about 7 percent of that required for the solid cones. An additional benefit in configuring the raised features 110 as hollow concave cones is that, when the deforming pressure is applied, this shape can facilitate the flow of excess adhesive or thermal grease 160 (FIG. 1A, FIG. 3) away from areas of nearest contact between components to areas which could benefit from additional adhesive or grease 160.

Figure 9E:
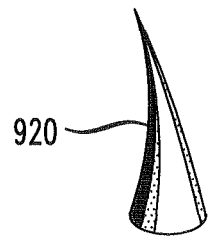

In some cases, such as shown in FIGS. 9B and 9C, the curved raised features 110 are symmetrically curved. In other cases, the curved raised features 110 can be asymmetrically curved. An asymmetrical curve can help further reduce the deforming pressure required to achieve compression of the raised features 110. For example, the curved raised features 110 can be a right-angled cone (FIG. 9D), or, asymmetric concave cone (FIG. 9E). As a further example, FIG. 5 shows substantially pyramidal-shaped raised features 110 that are asymmetrically curved.

Figure 10A:
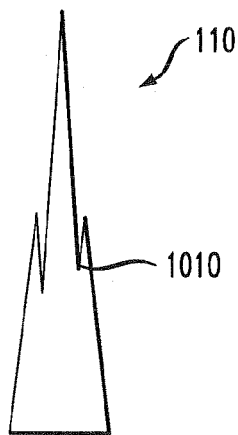
Figure 10B:
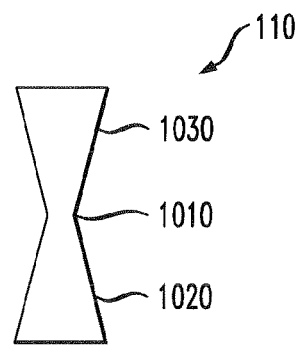

FIGS. 10A and 10B present perspective and cross-section view of example raised features 110 having a singularity 1010. The term singularity 1010 as used herein refers to any sharp discontinuity in the smoothness or shape surface of the raised feature 110 along the at least one dimension 115 to be compressed. In some embodiments, one or more of the raised features 110 have a singularity 1010 along the at least one dimension 115. The presence of the singularity 1010 can help to reduce the deforming pressure 305 required to achieve compression of the raised features 110. For example when the deforming pressure 305 is applied, the first bend in the raised feature 110 can occur in the vicinity of the singularity 110. In the example raised feature 110 shown in FIG. 10A, the singularity 1010 is a configured as a caldera. In the example raised feature 110 shown in FIG. 10B, the singularity 1010 is located at the point where a cone 1020 and inverted cone 1030 portions of the raised feature 110 are connected. In still other embodiments the singularity can be a sharp inward (e.g., a crimp) or outward (e.g., a bump) indentation in the otherwise smooth surface of the raised feature, or a bump.

Figure 11:
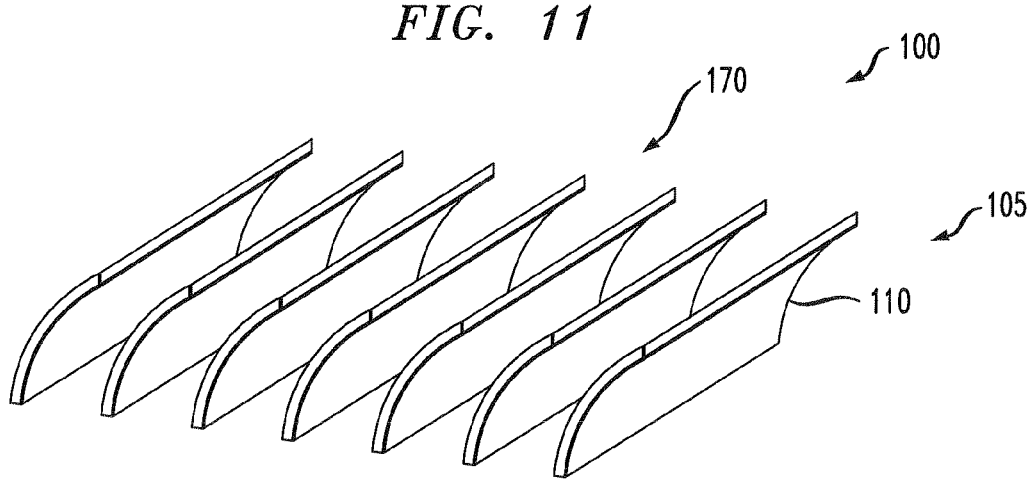

In still other embodiments of the apparatus 100, the raised features 110 can be configured as fins and be arranged as a one-dimensional array 170 of fins. Such an embodiment is depicted in the perspective view of FIG. 11, where each of the raised features 110 is a fin. Similar to that discussed above for the two-dimensional arrays 170, The thickness of the fins, the spacing between fins and the curvature of the fins can all be adjusted to change the properties of the heat-transfer structure 105. For instance, as illustrated in FIG. 11, to minimize the amount of pressure that has to be applied to achieve compression the fins can be curved. A curved fin can require less pressure to compress as compared to a straight fin because a bending mode of compression will be induced over a buckling mode of compression. Raised features 110 configured as fins can be arranged to collapse onto an adjacent fin, when a compression pressure is applied, thereby creating an additional path for heat transfer, similar to that discussed above in the context of FIG. 3. In some cases, cross-cuts that are singularities can be made perpendicular to the length of the fin to facilitate local conformity to irregular surface of a component.

Referring again to FIGS. 1A and 3, another embodiment of the apparatus 100 comprises a first substrate 130 having a first surface 125 and a second substrate 132 having second surface 127 facing the first surface 125. The apparatus 100 also comprises an array 170 of metallic raised features 110 being located on the first surface 125, each raised feature 110 being in contact with the first surface 125 to the second surface 127, a portion 156 of the raised features 110 being deformed via a compressive force 305.

In some embodiments there can be two arrays 170, 171 on each of the surfaces 125, 127 (FIG. 1B). In some embodiments, the metallic deformable raised features 110 provide physical connections between portions of a region 172 (FIG. 1A) of the first surface 125 and the second surface 127, wherein the region 172 of the first surface 127 is non-planar. In some embodiments, the each of the metallic raised features 110 form a continuous phase of metal directly linking the first and second surfaces, 125, 127. In some embodiments, the array 170 is a two-dimensional array of cones, posts (e.g., raised features 110 configured as posts or cones). In some embodiments, the metallic raised features 110 are fins (e.g., FIG. 11). In some embodiments the each metallic raised feature 110 includes two metal layers 710, 720 (e.g., FIG. 7), each metal layer 710, 720 comprising a different metal. In some embodiments each of the metallic raised features 110 has substantially the same height 115. In some embodiments, the metallic deformable raised features 110 are hollow (e.g., FIG. 9A-9C). In some embodiments, there are at least two groups 810, 820 of the metallic deformable raised features 110 having two different heights 815, 825 (e.g., FIG. 8). In some embodiments, one or more of the metallic raised features 110 has a curved surface 925 (FIG. 9) or a singularity 1010 (FIG. 10). In some embodiments, each substrate 130, 132 is an integrated circuit.

Referring again to FIG. 2, another embodiment of the apparatus 100 comprises a metallic planar substrate 220 having a front surface 225 and back surface 230, the back surface 225 being opposite the front surface 225. The apparatus 100 further comprises at least one array 170 (and in some cases two arrays) 170, 250) of metallic raised features 110 located directly on each of the surfaces 225, 230. In some embodiments the apparatus 100 FIG. 2 can further comprise a first substrate 130 (e.g., a first integrated circuit) having a first surface 125 and a second substrate 132 (e.g., a second integrated circuit) having a second surface 127, each of the first and second surfaces 125, 127 being in direct physical contact with the raised features 110 of one of the arrays 170, 250.

Figure 12:
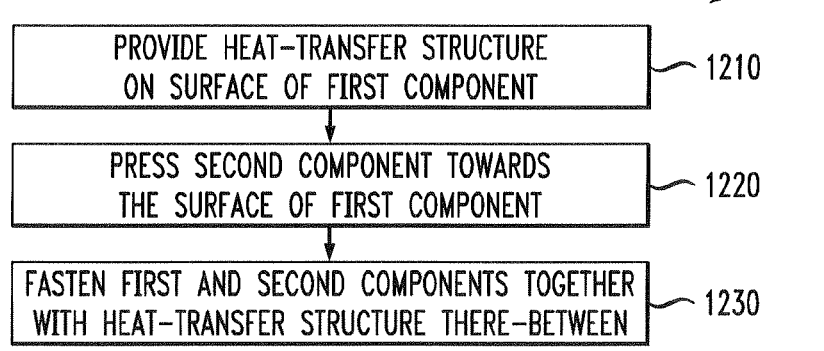
FIG. 12 presents a flow diagram of selected steps in an example method of using an apparatus of the disclosure, e.g., as in FIGS. 1A-3.

Another embodiment of the disclosure is a method of using an apparatus. FIG. 12 presents a flow diagram of selected step in an example method 1200 of using an apparatus 1200, such as the apparatus 100 in FIGS. 1A-3. With continuing reference to FIGS. 1A-3, the method 1200 comprises a step 1210 of providing a heat-transfer structure 105 on a surface 125 of a first component 130 of an electrical device 145. The heat-transfer structure 105 includes metallic deformable raised features 110.

Any of the embodiments of the raised features 110 can be provided in step 1210. The raised features 110 are configured to be compressed in at least one dimension 115 as compared to a pre-deformed shape (e.g., shapes such as presented in FIG. 1A, 1B or 2). In some preferred embodiments each of the raised features 110 have at least one second dimension 120 of about 1 millimeters or less.

In some cases providing the raised features 110 in step 1210 can include forming the raised features on one or both interfacial surfaces 125, 127 of the components 130, 132. In other cases providing the raised features 110 in step 1210 can include placing a pre-formed heat-transfer structure such as shown in FIG. 2, on one of the interfacial surfaces 125, 127.

The method 1200 also comprises a step 1220 of pressing a second component 132 of the electrical device 145 towards the first component 130 such that the heat-transfer structure 105 is located in-between the first component 130 and the second component 132 and the raised features 110 are compressed in the at least one dimension by at least about 1 percent as compared to before the first component 130 and the said component 132 are contacted to each other. For example, in some embodiments the pressing step 1220 includes imparting a deforming pressure of at least about 0.7 mPa.

In cases such as shown in FIG. 1B, when the second component 132 also has a second heat-transfer structure 105 located on a surface 127, the pressing step 1220 can compress the raised features 110 located on both surfaces 125, 127. In cases such as shown in FIG. 2 where the heat-transfer structure 105 includes raised features 110 on one or both sides 225, 230 of a substrate 220, the pressing step 1220 can compress the raised features 110 located on both sides 225, 230.

Some embodiments of the method further include a step 1230 of fastening together the two components 130, 132, with the heat-transfer structure located there-between. In some cases, the fastening step 1230 can be achieved using mechanical clamps to hold the components 130, 132 together. In other cases the fastening step 1230 can be achieved by locating an adhesive 160 between the raised features 110 prior to the pressing step 1220.

With continuing reference to FIGS. 1A and 12, in another embodiment of the method 1200 comprises (step 1210) providing a heat-transfer structure 105 on a surface 125 of a first component 130 of an electrical device 145, wherein the heat-transfer structure 105 includes metallic deformable raised features 110. As shown in FIG. 3 the method 1200 also comprises (step 1220) pressing a second component 132 of the electrical device 145 towards the surface 125 such that the heat-transfer structure 105 is located in-between the first component 130 and the second component 132, such that at least a portion 154 (FIG. 1A) of the metallic deformable raised features 110 are deformed to reduce heights 115 (FIG. 3) thereof by at least about 1 percent as compared to the heights 115 (FIG. 1A) of the raised features 110 before the pressing.

Figure 13:
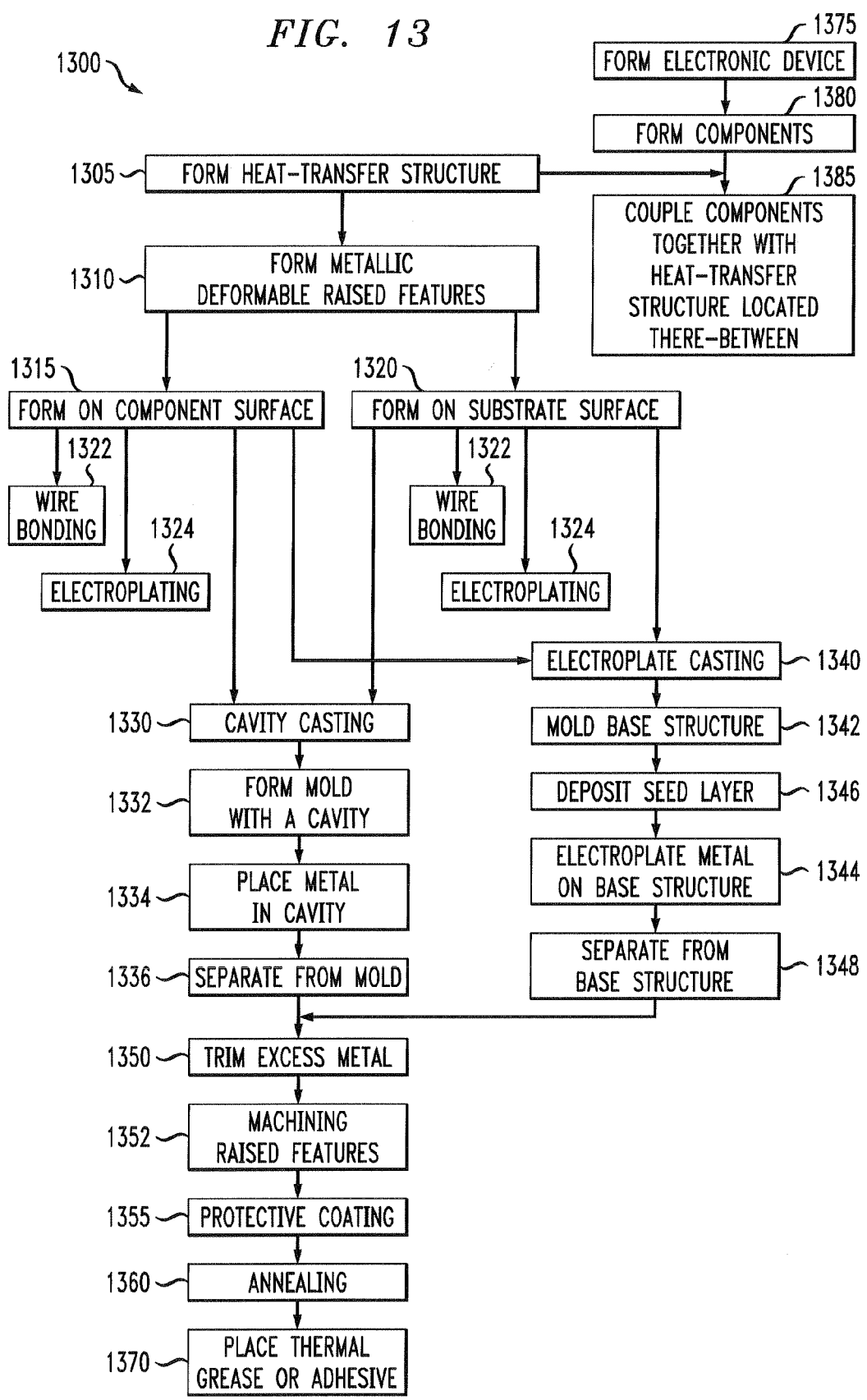
FIG. 13 presents a flow diagram of selected steps in an example method of manufacturing an apparatus of the disclosure, e.g., as in FIGS. 1A-12.

Another embodiment is a method of manufacturing an apparatus. FIG. 13 presents a flow diagram of selected steps in an example method 1300 of manufacturing an apparatus and its parts, such as shown in FIGS. 1A-11.

With continuing reference to FIGS. 1A-11, the method 1300 includes forming a heat-transfer structure 105 (step 1305), including a step 1310 of forming metallic deformable raised features 110.

In some cases, forming the raised features 110 (step 1310) includes a step 1315 of forming the raised features 110 on one or more surfaces 130, 132 of components 130, 132 of the apparatus 100. In some cases, forming the raised features 110 (step 1310) includes a step 1320 of forming on one or more surfaces 210, 215 of a substrate 220 that is part of the heat-transfer structure 105.

Any of the embodiments of the apparatus described herein can be manufactured by the method. As discussed above, in some preferred embodiments, the raised features 110 are configured to be compressed in at least one dimension 115 by at least 1 percent and have at least one second dimension 120 of about 1 millimeters or less.

In some cases, forming the raised features 110 on a surface in step 1315 includes a wire bonding step 1322 to form raised feature 110 directly on a component surface 125. For example raised features 110 configured as posts such as depicted in FIG. 4 can be formed by stud bumping in accordance with step 1322. One skilled in the art would be familiar with the wire bonding processes and the other types of shapes of raised features 110 that could be produced by wire bonding. For instance, raised features having loops could be formed in step 1322.

In some cases, forming the raised features 110 on a surface in step 1315 includes an electroplating step 1324 to form raised feature 110 directly on a component surface 125. One skilled in the art would be familiar with the electroplating processes that could be used to form raised features. For example one or more metals could be electroplated through openings in a photoresist layer located on a component surface 125 to form raised features 110 configured as single-layer or multilayered posts, such as depicted in FIG. 7.

In some cases, forming the raised features on a substrate surface in step 1320 could include the wire bonding step 1322 or the electroplating step 1324. For example, raised features 110 configured as posts could be formed on a surface 210 of a metal substrate 220 via the wire bonding or electroplating steps, 1322, 1324.

In some cases, forming the raised features (step 1310) includes a cavity casting process (step 1330). Cavity casting can have advantages that include low-cost processing and the ability to use with all types of metals. The cavity casting process (step 1330) includes a step 1332 of forming a mold. The mold has a cavity which replicates a shape of the raised features. Forming the mold can include forming a model of the raised features. In some cases the mold also replicates a substrate that interconnects the raised features. The cavity casting process (step 1330) also includes a step 1334 of placing metal into the cavity to thereby form the raised features. In some cases a liquid metal is placed in the mold in step 1334 and then allowed to cool. In other cases metal particles can be placed in the mold and then heated to liquefy the metal while in the cavity and then allowed to cool. The cavity casting process (step 1330) further includes a step 1336 of separating the raised features from the mold. In some cases, the separating step 1336 results in destruction of the mold, while in other cases, the mold is re-useable. For instance, the separating step 1336 may include heating in an oven such that a wax or polymer (e.g., thermoplastic or thermoset polymer) mold is melted or burned away. The separating step 1336 may include cleaning steps such as chemical or plasma cleaning to remove all of the mold material.

With continuing reference to FIG. 13, FIGS. 14A-14I present plan views of selected stages of an example cavity casting process in accordance with step 1330. FIG. 14A-14E show different stages in the step 1332 of forming a mold. FIG. 14A show a model 1405 fabricated to match the target shape of the raised features. For example, the model 1405 can be fabricated using a wide variety of technologies, such as three-dimensional printing or machining of polymer or wax materials. Such technologies are especially effective at fabricating a wide variety of shapes and sizes including shapes with ultra-high aspect ratios (e.g., raised features with height ratios of about 10 or greater). FIG. 14B shows the formation of a first mold 1410 including forming a cavity 1415 which replicates a shape of the raised features. For instance, the model 1405 can be used to make first molds 1410 using a room-temperature vulcanization of silicone rubber. FIG. 14C shows the mold 1410 after removing the model 1405 from the first mold.

FIG. 14D shows the first mold 1410 being used to make a second model 1420 (e.g., sacrificial second model such as a wax copy of the first model 1405) which is then removed from the mold 1410 (FIG. 14E). The second model 1420 is used to form a second investment mold 1425 (FIG. 14F) having a cavity 1430 which replicates a shape of the raised features. The second model 1420 is then removed from the second mold 1425 by destroying the second model 1420. For example the second model 1420 can be melted or burnt out of the cavity 1430 to provide an empty cavity 1430 (FIG. 14G). The second mold 1425 can then be used to make the raised feature 1435 using an investment-casting process such illustrated in FIGS. 14H-14I. For instance a metal 1440 can be placed in the cavity 1430 in accordance with step 1334 (FIG. 14H). The raised features 1445 can then be removed from the second mold 1420 in accordance with step 1336 (FIG. 14I).

For some raised features with complex shapes or some two-dimensional arrays of raised features, it can be difficult to remove the model 1405 from the mold 1410 without destroying one or both of the model 1405 or the mold 1410. In such cases, the first model 1405 can be used directly to form the second investment mold 1425 (FIG. 14F) instead of using the second model 1420.

As further illustrated in FIG. 13, in some cases, forming the raised features (step 1310) includes an electroplate casting process (step 1340). The electroplate casting process (step 1340) includes a step 1342 of molding a base structure to have a molded side that models a shape of the raised features. The electroplate casting process (step 1340) also includes a step 1344 of electroplating one or more metals on the molded side to thereby form the raised features. In some cases to facilitate electroplating step 1344 there can be a step 1346 of depositing a seed layer on the molded side prior to electroplating. Depositing the seed layer in step 1346 can include applying a conductive paint via brushing, spraying or other well-known application techniques, or, depositing a conductive layer via physical vapor deposition processes. For example, an electrically conductive paint can be applied to the molded side. The electroplate casting process (step 1340) further includes a step 1348 of separating the raised features from the base structure, similar to that described for step 1336.

FIGS. 15A-15D present cross-sectional views of selected stages of an example electroplate casting process in accordance with step 1340. The electroplate casting process 1340 is particularly useful for making raised features configured as two-dimensional arrays of hollow cones or other shapes, although solid raised features could also be made by this process 1340. With continuing reference to FIG. 13, FIG. 15A shows a base structure 1505 after forming a molded side 1510, in accordance with step 1342, to have a molded side that models a shape of the raised features. For instance a three-dimensional printing of plastic or wax materials as used to form the model 1405 (FIG. 14) could be used here to form the molded side 1510. FIG. 15B shows the base structure 1505 after depositing a seed layer 1515 on the molded side 1520 in accordance with step 1346. FIG. 15C shows the base structure 1505 after electroplating one or more metals (e.g. copper or silver) on the molded side 1510, and in the present example, on the seed layer 1515, to form the metal raised features 1540. FIG. 15D shows the raised features 1520 after being separated from the base structure 1505 in accordance with step 1348. For instance a wax base structure 1505 could be melted away to achieve separation in step 1348. As illustrated in FIG. 15D, in some cases the seed layer 1515 can be retained as part of the raised features 1520. In other cases the seed layer 1515 is removed from the raised features 1520 using conventional chemical of thermal processes.

Returning to FIG. 13, illustrated are a number of options steps to complete the formation of the raised features (step 1310) and heat-transfer structure. For instance, there can be a trimming step 1350 to, remove excess metal structures (e.g., substrate or handle structures) from the raised features, or, a machining step 1352 to further shape the raised features. The raised features can be covered with a protective coating (e.g., benzimidazole) in step 1355, to prevent oxidation of the metal or metals that the raised features are composed of. Preferably the coating is thin enough (e.g., about one to ten molecular layers) so as not to increase the thermal resistance of the raised feature. An annealing step 1360 can be performed to advantageously reduce the modulus of the raised features. For example, the modulus of electroplated copper posts can be reduced by annealing at 400° C. or higher. Forming the heat-transfer structure (step 1305) can further include a step 1370 of placing adhesive or thermal grease 160 between raised features 110.

One skilled in the art would be familiar with other steps in the manufacture of the apparatus, depending on the apparatus's particular configuration (e.g., remote radio head, base station, computer or other part of a telecommunication system). For instance, the method 1300 can include a step 1375 forming an electronic device (e.g., a circuit board) of the apparatus. Forming the device (step 1375) can include forming components of the device in step 1380. One of ordinary skill in the art would be familiar with the steps 1380 to manufacture electronic device components (e.g., a heat sink or integrated circuit). In cases where the heat-transfer structure is formed directly onto one or more components, forming the raised features (step 1310) can be part of forming the components (step 1380).

Some embodiments of method 1300 can further include coupling the device components together with the heat-transfer structure located there-between in step 1385. The coupling step 1385 can include any of the embodiments of the method of use 1200 such as described above in the context of FIG. 12 and accompanying text.

With continuing reference to FIG. 13, in another embodiment of the method, forming a heat-transfer structure 105 (step 1305) includes (step 1310) including forming a two dimensional array 170 of pressure deformable metallic raised features 110 on a substantially planar substrate surface 125. The array 170 can include a property selected for the group consisting of: (A) the raised features are hollow (e.g., FIG. 9); (B) the raised features are electroplated (e.g., FIG. 7); and (c) a first group 810 of the raised features 110 have a first height 815 and a second group 820 of the raised features 110 have a different second height 825 (e.g., FIG. 8).

In some embodiments, of the method, the raised features 110 are metal plated. In some embodiments the method 1200 further includes placing adhesive or thermal grease 160 between the metallic deformable raised features 110. In some embodiments the method 1200 further includes heat annealing the metallic deformable raised features 110 to reduce the modulus of the metallic deformable raised features 110.

Although the embodiments have been described in detail, those of ordinary skill in the art should understand that they could make various changes, substitutions and alterations herein without departing from the scope of the disclosure.

What is claimed is:
1. An apparatus, comprising:
  a metallic planar substrate having a front surface and a back surface, the back surface being opposite the front surface;
  an array of metallic raised features located directly on each of the front and back surfaces, wherein a portion of the raised features are configured to be mechanically bend or buckle plastically deformable via a compressive force applied between a first substrate and a second substrate, wherein one or more of the metallic raised features has a surface singularity therein prior to the mechanical bend or the buckle plastic deformation produced by the com- pressive force and wherein the one or more surface singularities are configured as caldera.

2. The apparatus of claim 1, wherein the metallic raised features are hollow.

3. The apparatus of claim 1, wherein there are at least two groups of the metallic raised features having two different heights.

4. The apparatus of claim 1, wherein
the first substrate is a first integrated circuit having a first surface; and
the second substrate is a second integrated circuit having a second surface, each of the first and second surfaces being in direct physical contact with deformable ones of the raised features of one of the arrays.

5. The apparatus of claim 1, wherein the mechanically deformable metallic raised features provide physical connections between portions of a region of the first surface and the second surface, wherein the region of the first surface is non-planar.

6. The apparatus of claim 1, wherein the one or more surface singularities are in a vicinity of initial locations of the mechanical bend or the buckle plastic deformation.

7. An apparatus, comprising:
a metallic planar substrate having a front surface and a back surface, the back surface being opposite the front surface;
an array of metallic raised features located directly on each of the front and back surfaces, wherein a portion of the raised features are configured to be mechanically bend or buckle plastically deformable via a compressive force applied between a first substrate and a second substrate, wherein one or more of the metallic raised features has a surface singularity therein prior to the mechanical bend or the buckle plastic deformation produced by the compressive force and wherein the metallic raised features include a first cone-shaped portion and a second inverted cone-shaped portion and the surface singularity is located at a connection point between the first cone-shaped portion and the second inverted cone-shaped portion.

8. An apparatus, comprising:
a metallic planar substrate having a front surface and a back surface, the back surface being opposite the front surface;
an array of metallic raised features located directly on each of the front and back surfaces, wherein a portion of the raised features are configured to be mechanically bend or buckle plastically deformable via a compressive force applied between a first substrate and a second substrate, wherein one or more of the metallic raised features has a surface singularity therein prior to the mechanical bend or the buckle plastic deformation produced by the compressive force and wherein the metallic raised features include a plurality of merged cone-shaped features and the surface singularities are located at discontinuous merger points between adjacent one of the merged cone-shaped features.

9. The apparatus of claim 8, wherein the metallic raised features are cones.

10. An apparatus, comprising:
a metallic planar substrate having a front surface and a back surface, the back surface being opposite the front surface;
an array of metallic raised features located directly on each of the front and back surfaces, wherein a portion of the raised features are configured to be mechanically bend or buckle plastically deformable via a compressive force applied between a first substrate and a second substrate, wherein one or more of the metallic raised features has a surface singularity therein prior to the mechanical bend or the buckle plastic deformation produced by the compressive force and wherein the surface singularities are located at cross-cut points in the length of the metallic raised feature.

11. The apparatus of claim 10, wherein the metallic raised feature. are fins.

12. The apparatus of claim 10, wherein the metallic raised features are posts.

\* \* \* \* \*